(12) United States Patent
Smith et al.

(10) Patent No.: US 7,232,768 B2
(45) Date of Patent: Jun. 19, 2007

(54) HYDROGEN PLASMA PHOTORESIST STRIP AND POLYMERIC RESIDUE CLEANUP PROCESS FOR LOW DIELECTRIC CONSTANT MATERIALS

(75) Inventors: Patricia B. Smith, Colleyville, TX (US); Mona M. Eissa, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/622,821

(22) Filed: Jan. 12, 2007

(65) Prior Publication Data

US 2007/0117341 A1    May 24, 2007

Related U.S. Application Data

(62) Division of application No. 11/140,771, filed on May 31, 2005, now Pat. No. 7,179,751, which is a division of application No. 09/975,639, filed on Oct. 11, 2001, now Pat. No. 6,967,173.

(60) Provisional application No. 60/248,996, filed on Nov. 15, 2000.

(51) Int. Cl.
*H01L 21/461*   (2006.01)
*H01L 21/302*   (2006.01)

(52) U.S. Cl. .............. 438/725; 438/738; 257/E21.252; 257/E21.255; 257/E21.256

(58) Field of Classification Search ................ 438/725, 438/738
See application file for complete search history.

(56) References Cited

U.S. PATENT DOCUMENTS

| 6,281,135 | B1 * | 8/2001 | Han et al. ................... 438/725 |
| 6,379,574 | B1 * | 4/2002 | Ou-Yang et al. .............. 216/49 |
| 6,426,304 | B1 | 7/2002 | Chien et al. |
| 6,440,864 | B1 | 8/2002 | Kropewnicki et al. |
| 6,562,726 | B1 | 5/2003 | Torek et al. |
| 6,613,681 | B1 | 9/2003 | Hillyer et al. |
| 6,652,709 | B1 * | 11/2003 | Suzuki et al. .......... 156/345.41 |
| 6,667,244 | B1 | 12/2003 | Cox et al. |
| 6,962,879 | B2 * | 11/2005 | Zhu et al. ................... 438/724 |

* cited by examiner

*Primary Examiner*—Alexander Ghyka
(74) *Attorney, Agent, or Firm*—Rose Alyssa Keagy; W. James Brady; Frederick J. Telecky, Jr.

(57) ABSTRACT

A method (100) of fabricating an electronic device (200) formed on a semiconductor wafer. The method forms a layer (215) of a first material in a fixed position relative to the wafer. The first material has a dielectric constant less than 3.6. The method also forms a photoresist layer in (216) a fixed position relative to the layer of the first material. The method also forms at least one void (220) through the layer of the first material in response to the photoresist layer. Further, the method subjects (106) the semiconductor wafer to a plasma which incorporates a gas which includes hydrogen so as to remove the photoresist layer.

1 Claim, 4 Drawing Sheets

HYDROGEN PLASMA PHOTORESIST STRIP AND POLYMERIC RESIDUE CLEANUP PROCESS FOR LOW DIELECTRIC CONSTANT MATERIALS

CROSS-REFERENCES TO RELATED APPLICATIONS

This is a divisional application of application Ser. No. 11/140,771, filed May 31, 2005, now U.S. Pat. No. 7,179,751 which is a divisional application of application Ser. No. 09/975,639, filed Oct. 11, 2001, now U.S. Pat. No. 6,967,173, issued on Nov. 22, 2005 which claims the benefit of U.S. Provisional Application No. 60/248,996, filed Nov. 15, 2000.

STATEMENT REGARDING FEDERALLY SPONSORED RESEARCH OR DEVELOPMENT

Not Applicable.

BACKGROUND OF THE INVENTION

The present embodiments relate to semiconductor device fabrication and are more particularly directed to clean-up processing following photoresist patterning and etching of a low-dielectric constant material.

Integrated circuit technology continues to advance at a rapid pace, with many circuit technologies being implemented using semiconductor fabrication processes. With the advancement of semiconductor circuit fabrication, consideration is given to various aspects, including maximizing efficiency, lowering manufacturing cost, and increasing performance. With these goals in mind, low dielectric constant materials are now being considered as favorable for various insulating layers, sometimes referred to as interlevel dielectrics, used in a semiconductor circuit. In the past, such insulating layers were implemented using silicon dioxide (i.e., $SiO_2$). Silicon dioxide has a dielectric constant, sometimes referred to in the art by the value k, on the order of 4.0. However, relatively lower dielectric constant values, such as on the order of 2.7 or 2.8, are now achieved by incorporating carbon within the silicon dioxide, thereby creating what is referred to in this document as a carbon-containing oxide. Carbon-containing oxides are sold under various trade names, such as organo-silicon glass ("OSG") commercially available from Novellus and black diamond commercially available from Applied Materials. Carbon-containing oxides may contain a considerable amount of carbon, such as on the order of 20 to 30 atomic percent (i.e., amount of carbon per atomic volume). The inclusion of the carbon drives down the dielectric constant which is a highly desirable goal. Specifically, by reducing the dielectric constant, such as is achieved by these carbon-containing oxides, semiconductor devices may be constructed using thinner films for insulating layers. This approach decreases device size and cost. Performance is also increased, such as by way of example where metal lines (e.g., copper) are formed closer together due to the thinness of the low-dielectric constant carbon-containing oxide which separates the metal from other layers/regions/devices.

While carbon-containing oxides have advanced various goals in the formation of semiconductor circuits, the present inventors have observed a considerable drawback in the use of such low dielectric constant (known as low k) materials. Specifically, during the formation of semiconductor circuits, and as also detailed later, it is known in the art to use photoresist materials as a mask for etching through an insulating layer, such as a silicon dioxide layer, to provide for example, vias, trenches, or other areas through which electrical contact may be made to various points covered by the insulating layer. Once the photoresist has served its masking purpose, it along with any related residue is removed. This process is sometimes referred to as a clean-up or a strip, and such removal has been achieved in the art by various different processes. However, the present inventors have observed that these traditional photoresist-removal processes, while effective for ordinary silicon dioxide, negatively affect a lower dielectric constant material such as a carbon-containing oxide. For example, one prior art photoresist-removal process uses an oxygen-based plasma at high temperature, that is, on the order of 250° C. However, when used with a carbon-containing oxide, the prior art use of an oxygen-based plasma causes the oxygen in the plasma to react with the carbon-containing oxide; in other words, rather than being inert with the carbon-containing oxide as is desired, the oxygen may cause the carbon-containing oxide to convert (lose carbon) in part and/or to diminish in width and/or in depth. Further complicating this issue is that manufacturers provide carbon-containing oxides that contain different percentages of carbon. As a result, the present inventors have observed a corresponding difference in the rate of carbon loss and width and/or depth loss of the carbon-containing oxide when the film is exposed to oxygen-containing plasma. For example, in the past rates of degradation were observed on the order of 25 Angstroms per minute exposure to oxygen-containing plasmas while more recently rates of degradation on the order of 100 Angstroms per minute have been observed. Thus, there is a need to reduce this degradation, and indeed such a need will continue should low k materials continue to show degradation on reaction with standard (e.g., $O_2$, 250° C.) photoresist removal processes.

In view of the above, there arises a need to address the drawbacks of the prior art and to provide a method for effectively removing post-etch polymers and photoresist from low dielectric constant materials, as is achieved by the preferred embodiments described below.

BRIEF SUMMARY OF THE INVENTION

In one preferred embodiment, there is a method of fabricating an electronic device formed on a semiconductor wafer. The method forms a layer of a first material in a fixed position relative to the wafer. The first material has a dielectric constant less than 3.6. The method also forms a photoresist layer in a fixed position relative to the layer of the first material. The method also forms at least one void through the layer of the first material in response to the photoresist layer. Further, the method subjects the semiconductor wafer to a plasma which incorporates a gas which includes hydrogen so as to remove the photoresist layer.

The method also may be further modified with additional steps. For example, the step of forming at least one void also may form a polymeric residue in response to the photoresist layer, and the method may further comprise the step of removing the polymeric residue. Various alternatives are provided for performing this removal step. Other aspects are also disclosed and claimed.

DETAILED DESCRIPTION OF THE INVENTION

Figure 1:
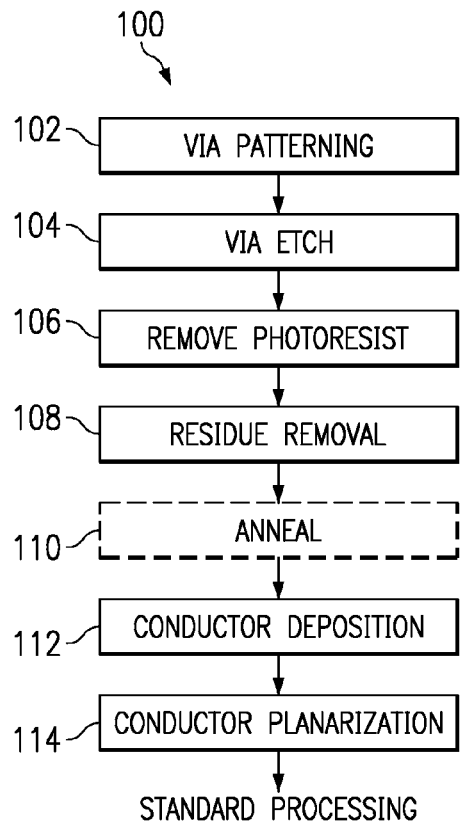
FIG. 1 illustrates a method of processing steps for forming a conducting interconnect after photoresist removal and FIG. 2a illustrates a cross-sectional view of a semiconductor device after various processing steps and including a planarized low dielectric constant insulating layer across the top of the device.

For purposes of demonstrating the preferred embodiments, FIG. 1 illustrates a step diagram of a method 100 for forming an interconnect structure for a semiconductor circuit device 200 shown generally in FIGS. 2a through 2f. By way of introduction, both the prior art and the inventive embodiments described below may be implemented using the steps shown as generally labeled method 100 in FIG. 1, but further elaboration for certain of those steps is provided below according to the preferred embodiments. Further with respect to differentiating the prior art and the preferred embodiments, in a general sense the items within semiconductor circuit device 200 are known in the art, while it should be understood that in the preferred embodiment device 200 includes interlevel and intermetal dielectric layers possessing a low dielectric constant, k, used in combination with a photoresist layer that is subsequently removed according to the preferred embodiment as further detailed below. Finally, while the methods of the preferred embodiments are described with reference to FIGS. 2a through 2f, those methods may be applied to any type of device structure (e.g., metal interconnects, metal lines, metal gates, or other conductive structures) and to any type of device (e.g. memory devices, logic devices, power devices, digital signal processors, or microprocessors) in which a low-dielectric constant layer or any materials negatively affected with the use of oxygen plasma is included.

Figure 2A:
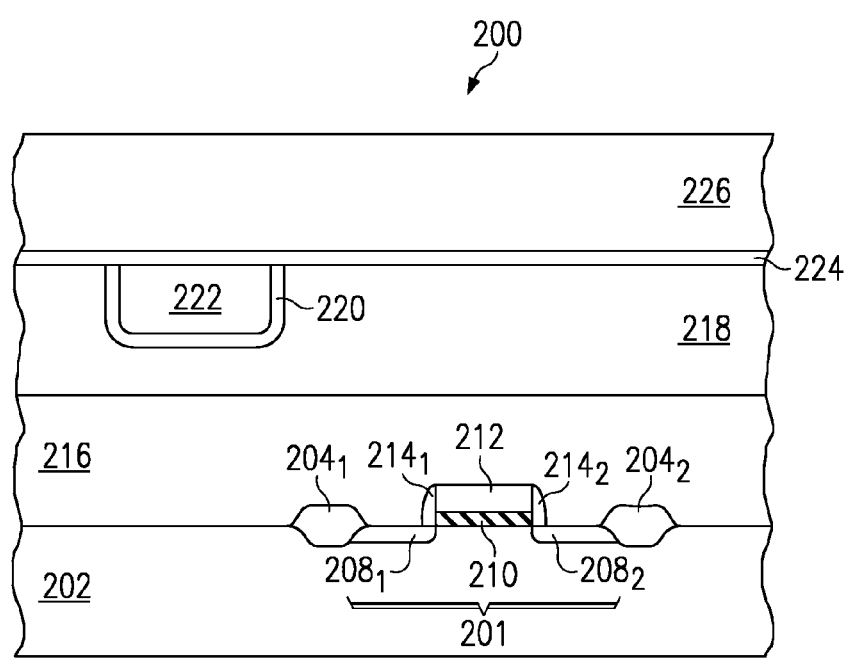

Turning first to device 200 of FIG. 2a, it includes various device components that are formed as is known in the art, and which may form various devices such as a transistor that is only shown by way of example formed in connection with an active area 201 formed in a substrate 202 (e.g., silicon). Substrate 202 is part of, or represents, a semiconductor wafer providing the foundation for device 200. Further, the wafer may be enclosed within one or more tools as further discussed below to accomplish the various steps described in this document. Active area 201 is generally defined between isolation regions $204_1$ and $204_2$. Within active area 201, source and drain regions $208_1$ and $208_2$, a gate dielectric 210, a conductive gate 212, and sidewall insulators $214_1$ and $214_2$ are formed, thereby creating a transistor by way of example. A dielectric layer 216 is formed overlying the transistor shown therein and is planarized, where dielectric layer 216 therefore overlies the portion of the device containing active (and possibly passive) components formed as is known in the art. A second dielectric layer 218 is shown to overlie dielectric layer 216, although in fact layers 216 and 218 may be one layer.

Continuing with FIG. 2a and the additional items therein, note that multiple levels of interconnect structure may be formed and may connect to one another and also to various of the components formed in relation to substrate 202. Due to the many possibilities of the connections that may be achieved by such interconnect structures and the components to which they may connect, considerable extra detail is not necessary with respect to a specific connection as it may be readily ascertained by one skilled in the art. Thus, only a particular example is provided below merely to demonstrate a context and not by way of limitation for the intended inventive scope. For the specific example, a liner/barrier layer 220 is formed within trench structure formed in dielectric layer 218, and a conductor 222 is formed to align with liner/barrier 220 and is planarized along the top surface of dielectric layer 218. By way of example, assume that conductor 222 is copper, although it may be formed from other conducting materials. Thereafter, a barrier layer 224, often referred to as an etch stop layer and commonly on the order of a few hundred angstroms of $SiN_x$, is formed over dielectric layer 218 and, thus, also over the top of conductor 222.

The remaining illustrated items in FIG. 2a introduce aspects particularly relevant to the preferred embodiment. Overlying barrier layer 224 is formed a dielectric layer 226. In the preferred embodiment, dielectric layer 226 is of a different material than the dielectric layers closer to substrate 202. Further, dielectric layer 226 preferably has a relatively low dielectric constant, k, such as below the value of 4.0 typically found in silicon dioxide, whereas the dielectric layers closer to substrate 202 are likely to have higher dielectric constants (e.g., closer to 4.0). Focusing now on dielectric layer 226, it is preferably achieved using a carbon-containing oxide as that term is defined in the earlier "Background Of The Invention" section of this document, and which may be obtained using the commercially available products also mentioned earlier (or other low dielectric constant alternatives thereto). For example, where OSG is used for dielectric layer 226, its dielectric constant may be, by way of example, on the order of 2.7 or 2.8.

Figure 2B:
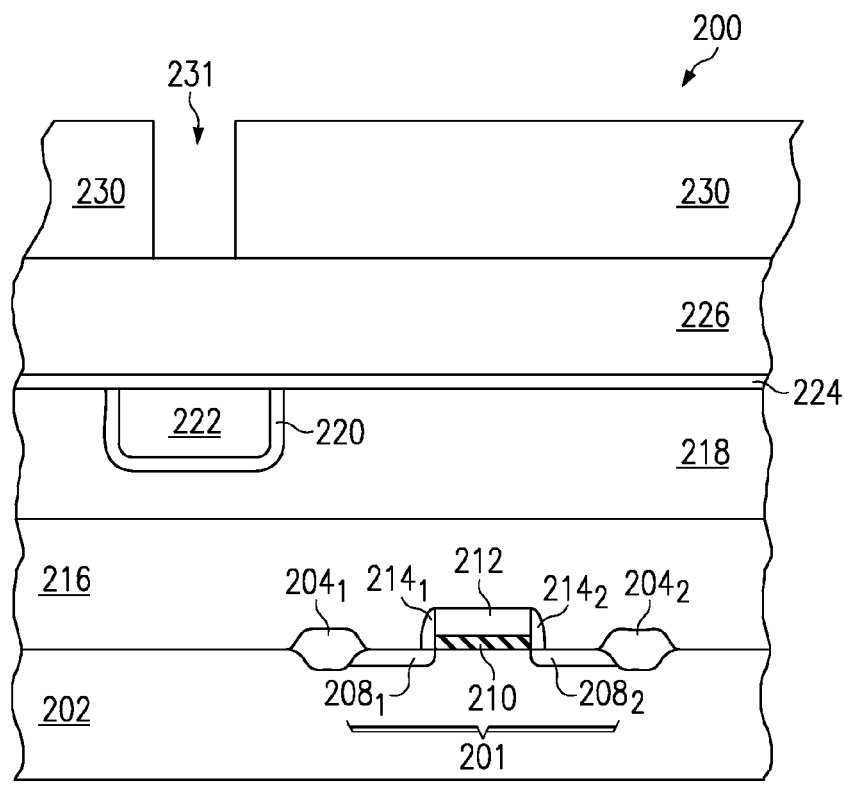
FIG. 2b illustrates a cross-sectional view of the semiconductor device of FIG. 2a after a photoresist layer is formed over the low dielectric constant insulating layer and with an opening formed in the photoresist layer.

FIG. 2b illustrates device 200 in connection with step 102 of method 100 in FIG. 1. Specifically, step 102 in FIG. 1 recites the step of via patterning, which as known in the art involves creating an opening or void (or more than one void) in a photoresist layer so that a corresponding via, trench, or other appropriate pattern may be later made through an underlying interlevel dielectric layer. Relating this step to FIG. 2b, first a photoresist layer 230 is formed and patterned over dielectric layer 226, where photoresist layer 226 by way of example may be a deep ultraviolet ("DUV") photoresist layer. Note that photoresist layer 230 and the underlying interlevel dielectric layer 226 may be on the same order of thickness, such as in the range of 5000 to 10,000

Angstroms. Next, step 102 forms an opening 231 according to the pattern imposed on photoresist layer 230, where opening 231 is positioned so that a respective subsequent metal connection may be made to an underlying component of device 200.

Figure 2C:
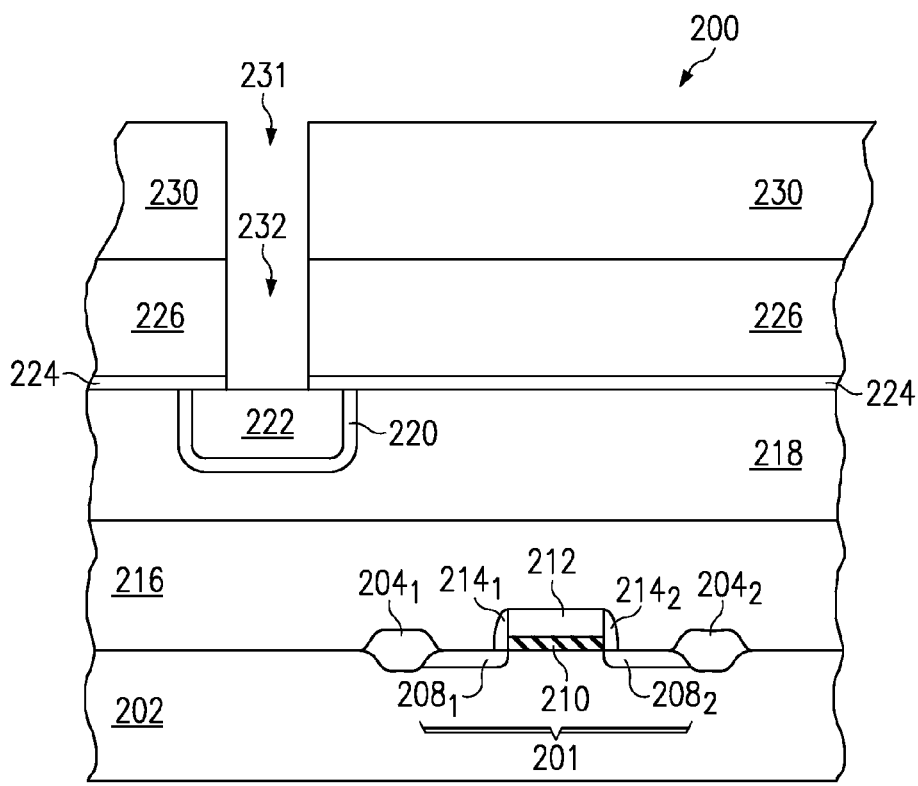
FIG. 2c illustrates a cross-sectional view of the semiconductor device of FIG. 2b after a via is etched through the low dielectric constant insulating layer.

FIG. 2c illustrates device 200 in connection with step 104 of method 100 in FIG. 1. Specifically, step 104 in FIG. 1 recites the step of via etching, which forms a via 232 through dielectric layer 226 and aligned with opening 231 in photoresist layer 226. Via 232 may be formed using various processes. For example, via etching may be accomplished by subjecting semiconductor device 200 to $CF_4$, $CHF_3$, or another fluorinated compound plasma environment. For reasons more clear below, note also that the via etching chemistry reacts with the exposed portions of dielectric layer 226 (i.e., along the vertical walls within via 232) as well as photoresist layer 230 so that a fluorinated hydrocarbon polymeric crust residue forms on top of photoresist layer 230. This crust residue is not expressly shown in the Figures but is understood to be present, and it is noted because it is desirable to remove the crust so that it does not interfere with the yield of the device. Further, this crust remains on the surface of photoresist layer 230 and at least portions of it also remain after photoresist layer 230 is removed, as further explored below.

An additional issue arises in FIG. 2c with respect to the depth of the via etch insofar as barrier layer 224 is concerned. Specifically, when via 232 is formed through dielectric layer 226, then barrier layer 224, as an etch stop layer, typically forms a barrier, that is, it is a point at which the via etch stops so that the chemistry used to accomplish the via does not reach the underlying copper in conductor 222 but instead stops at the barrier layer. However, as further explored later, the etch may indeed penetrate the barrier layer and reach the underlying metal. To illustrate this possibility, FIG. 2c illustrates that barrier layer 224 is removed within via 232. As a result and only by way of example, assume that the via etch chemistry contacts copper conductor 222.

Figure 2D:
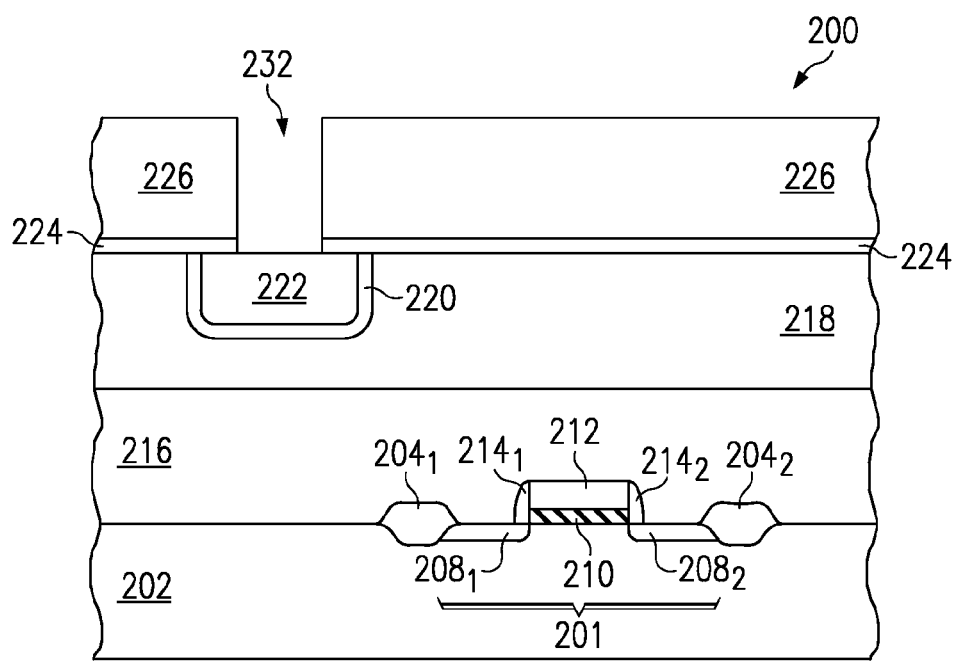
FIG. 2d illustrates a cross-sectional view of the semiconductor device of FIG. 2c after the photoresist layer is stripped from the device.

FIG. 2d illustrates device 200 in connection with step 106 of method 100 in FIG. 1. Specifically, step 106 in FIG. 1 recites the step of removing the photoresist, which therefore is demonstrated in FIG. 2d in that photoresist layer 230 (from FIGS. 2b and 2c) is no longer shown. In the preferred embodiment, step 106 is performed using a gaseous plasma process, such as using a remote (or downstream) plasma, and this process may be achieved using a downstream plasma tool such as commercially available from Mattson Technology, Applied Materials, GaSonics International, or Fusion (more recently Axcelis) or other similar processing tools. Also, the pressure used in step 106 may vary considerably, and will likely be limited by the pressure made available by the tool used to perform the step; for example, typical pressures are between 0.1 and 2.0 Torr. The step 106 plasma includes some percentage of hydrogen and, indeed, a greater than 50% level of hydrogen is preferred. The hydrogen may be in various forms, such as $H_2$, or in other forms such as $NH_3$, $N_2H_2$, $H_2S$, and $CH_4$. Further, it has been determined in connection with the present inventive scope that adding a diluent gas such as nitrogen, argon, helium, neon, or xenon (or a similar unreactive gas component) may increase the rate at which photoresist layer 230 is removed. Thus, by way of an alternative embodiment, the plasma may be 80% hydrogen and 20% nitrogen or argon. However, it is perceived that nitrogen or argon in excess of 20% may not further increase removal rate and, hence, is not necessary. Further, the nitrogen also may be in various forms, where preferably those forms that are used include a free radical which is believed to be the aspect which improves the removal rate. Also, while argon may be used as an alternative diluent in lieu of nitrogen, it may lead to different removal rates than are achieved using the nitrogen diluent. Given the various possible combinations from the preceding, note that one preferred combination uses approximately 80% $NE_3$ and 20% $N_2$. Still further, note that step 106 is preferably performed at a relatively high temperature such as 250° C., while lower temperatures may be used although a reduction in temperature is likely to lower the rate of photoresist removal. Finally, it is noted that step 106 in the preferred embodiment excludes the use of any oxygen.

Step 108 of FIG. 1 relates to removal of the crust residue which, as described above, is created during the via etching step 104 when the fluorinated compound plasma reacts in part with the then existing photoresist layer 230 and exposed portions of dielectric layer 226 such as the walls of the via or trench as the structure is formed. In the preferred embodiment, step 108 is achieved using a wet etch chemistry. More particularly, step 108 is preferably achieved using a combination of dilute hydrofluoric acid and dilute citric acid. In the preferred embodiment of this combination, the hydrofluoric add is formed of 49% weight hydrofluoric add diluted with deionized water ("DIW") at a ratio between 1:500 to 1:1,000, and preferably on the order of 1:625. Also in the preferred embodiment of this combination, the citric acid is formed of 30% weight citric acid diluted with DIW at a ratio between 1:50 to 1:250, and preferably on the order of 1:50. Further, note that various other organic acids may be used in lieu of citric acid in the combination with the dilute hydrofluoric acid. For example, in an alternative embodiment dilute acetic acid may be used in place of the citric acid, where in this case the ratio of dilution of the acetic acid with DIW is on the order of 1:200, and with the acetic acid at full concentration (e.g., 99% weight or higher). Still another organic acid in lieu of the citric acid is oxalic acid.

Various additional observations may be made with respect to the chemistry of step 108. For example, the combination of hydrofluoric acid and the dilute organic acid is believed to perform two roles. First, the combination of the two dilute acids cleans the remaining polymeric residue on the surface of the dielectric layer (e.g., dielectric layer 226) as well as on its sidewalls within any void of the dielectric layer (e.g., the vertical surfaces of dielectric layer 226 within via 232). Second, if or to the extent that exposed copper is contacted by the combined acids, such as may occur by way of example in FIG. 2c if the copper conductor 222 is exposed by removal of barrier layer 224, the combination removes copper I and copper II oxide while not attacking the copper surface. Note also that the step 108 combination of acids is an aqueous solution and, therefore, is more environmentally friendly as compared to solvent solutions. Moreover, most solvents form a complex with copper surfaces and, thus, if used in step 108 and again to the extent that copper may be exposed, then the formation of the complex may undesirably affect the copper such as by increasing its sheet resistance (i.e., reducing the ability of the copper to conduct). In contrast, the chemistry of the preferred embodiment does not form such a complex.

Step 110 of FIG. 1 is shown in a dashed box because it is an optional step according to the preferred embodiment. If performed, step 110 is a low temperature anneal preferably performed in a reducing atmosphere, as may be achieved in the same tool, albeit it in a different chamber, as used for step 106 described above. The low temperature of step 110 may be on the order of 60° C., and the reducing atmosphere is preferably achieved using $H_2$ or $NH_3$ and diluted with $N_2$, argon, or other inert gas. In the preferred embodiment, the reducing atmosphere is on the order of 60% hydrogen and 40% nitrogen, although these amounts may vary further. Nonetheless, preferably the amount of nitrogen is not permitted to reach greater than 40% because such an amount may reduce the effectiveness of the copper reduction occurring during this step. Further, the nitrogen may be replaced with argon in order to preserve the integrity of the dielectric and the photoresist, as nitrogen-containing plasma exposure has been observed by the present inventors to render the photoresist poisoned or the dielectric material difficult to pattern for subsequent processing. Note that step 110 is implemented in an effort to remove any excess wet chemistry that may remain as a result of step 108 since a failure to remove such chemistry could result in pockets of such material being trapped by later processing steps. Note also that step 110 has a related benefit if it is applied following a via etch that exposed copper. In other words, in the example of FIG. 2c, via 232 may expose the top of conductor 222, and the present inventive scope contemplates that a via etch may apply to later interconnect layers as well. Thus, in addition to the example of conductor 222, the additionally contemplated later-etched layers also may include a via etch to an already-formed copper line, copper contact, or the like. In any of these cases, the exposed copper will be susceptible to oxidization, that is, if the device, while the via is formed, is exposed to an oxidizing atmosphere, then the copper may react with oxygen causing it to oxidize. However, if such copper is treated according to the hydrogen annealing step 110, then the reducing atmosphere, in addition to removing the wet chemistry from step 108, performs what is known in the art as passivation. The term passivation describes the result that the copper is rendered passive, or unreactive, for a period of time; that is, the positive charge on the copper is neutralized by the reducing atmosphere and, thus, while the copper remains in this passive state, it will not attract oxygen and, hence, it will not oxidize. Eventually, the passivation will lose at least some portion of its effectiveness, but presumably before that occurs, device 200 will be processed through one or more additional steps, such as described below, thereby also further removing the possibility of copper oxidation.

Figure 2E:
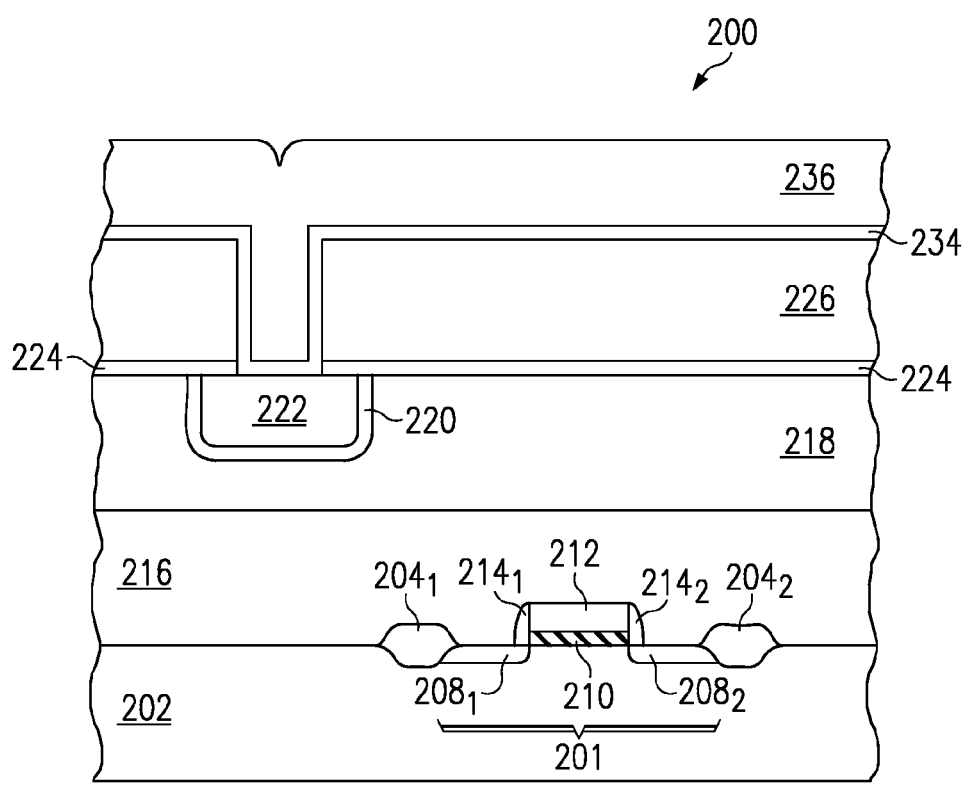
FIG. 2e illustrates a cross-sectional view of the semiconductor device of FIG. 2d after a liner layer and a conducting layer are formed over the device and which extend within the via shown in FIG. 2c.

FIG. 2e illustrates device 200 in connection with step 112 of method 100 in FIG. 1. Specifically, step 112 in FIG. 1 recites the step of conductor deposition, which by way of example in FIG. 2e actually involves the formation of two conductor layers. Particularly, first a liner/barrier 234 is preferably formed on dielectric layer 226 and within via 232 (see FIG. 2d), such as by chemical (CVD) or physical vapor deposition (PVD). Preferably, liner/barrier 234 is comprised of a material which will act as a diffusion barrier, will adhere to dielectric layer 226, will act as an adhesion layer for a later-formed conductor, and which is electrically conductive (more preferably liner/barrier 234 is comprised of Ti, TiN, Ta, TaN, or a stack composed of these materials). Second, a conductor 236 is formed, such as by electroplating or PVD. Conductor 236 is preferably comprised of aluminum, copper doped aluminum, copper, or another conductor or refractory metal.

Figure 2F:
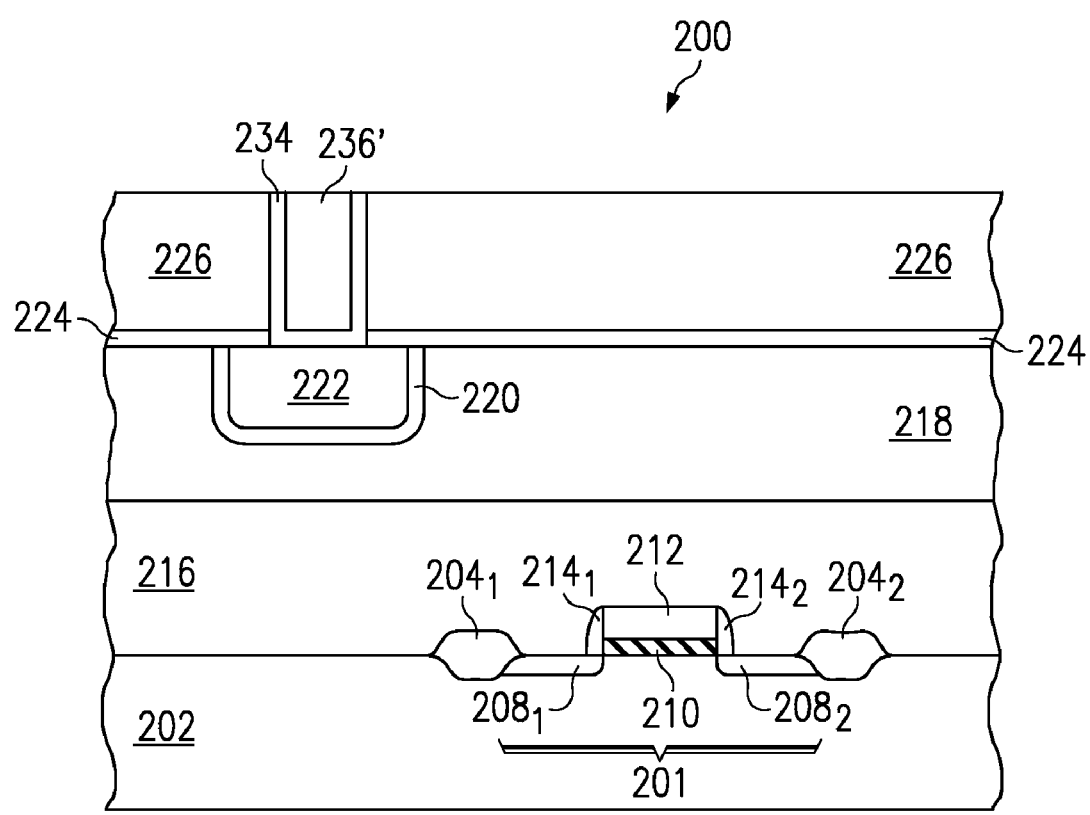
FIG. 2f illustrates a cross-sectional view of the semiconductor device of FIG. 2e after the conducting layer is planarized to form a conducting interconnect.

FIG. 2f illustrates device 200 in connection with step 114 of method 100 in FIG. 1. Specifically, step 114 in FIG. 1 recites the step of conductor planarization, which creates the resulting interconnect 236'. Preferably, the planarization is accomplished by chemical-mechanical polishing (CMP) or a blanket etch-back process. Further, the planarization may be such that the portions of liner/barrier 234 above dielectric layer 226 may be removed. Finally, following step 114, FIG. 1 demonstrates that processing can be performed using standard device processing techniques which are ascertainable by one skilled in the art.

Figure 3:
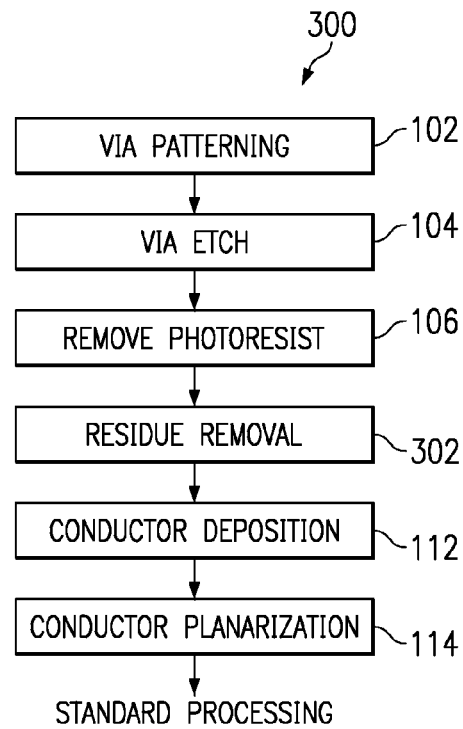
FIG. 3 illustrates a method of processing steps for forming a conducting interconnect after a photoresist removal and residue clean-up, wherein the photoresist removal step is implemented using a hydrogen-containing plasma step and the residue clean-up step is implemented using a mixture of hydrogen, oxygen, and fluorine.

FIG. 3 illustrates a step diagram of an alternative preferred method 300 also for forming semiconductor circuit device 200 shown generally in FIGS. 2a through 2f. Generally, method 300 includes various of the same steps as method 100 from FIG. 1, and these steps are readily identified in that the same reference numbers for such steps are carried forward from FIG. 1 into FIG. 3. Thus, by way of introduction to method 300, it includes the same steps 102, 104, 106, 112, and 114 from FIG. 1. Since the reader is assumed to be familiar with the earlier discussion of these mutual steps, a detailed discussion of those steps is not repeated with respect to method 300. However, method 300 differs from method 100 in two respects. First, residue removal step 108 from method 100 is replaced with a different residue removal step 302 as detailed below. Second, and for reasons also apparent below, method 300 does not include an optional anneal step 110.

Looking to the residue removal step 302 of method 300, recall that preceding this step is step 106 in which a hydrogen-containing plasma is used to remove a photoresist layer (e.g., photoresist layer 230). Next, step 302 of method 300 removes residue (e.g., fluorinated polymeric crust residue) also using a dry plasma process. Preferably, the step 302 dry plasma includes a combination of oxygen, hydrogen, and fluorine. Further, this combination may be diluted with some inert gas such as from a nitrogen source (e.g., $N_2$), or from other gases such as argon, xenon, helium, or neon. The inert gas is preferably 5-20% of the mixture, although such a diluting gas also may be left out from the overall mixture. It is noted that the prior art very heavily teaches away from an approach that combines hydrogen and oxygen in that it has heretofore been considered to be an unworkable combination of gases due to concerns of unpredictable or dangerous reactions. However, it is determined in connection with the present embodiment that such an approach is feasible and indeed quite effective for residue removal in step 302. Preferably, the oxygen source is $O_2$, and the oxygen is preferably 2-20% of the mixture, although percentages on the order of approximately 7% are likely optimal. Further, it is currently believed that the combination of the oxygen and fluorine is accomplishing the bulk of the work in removing the fluorinated polymeric crust residue. The source of fluorine may be any source of fluorine radicals such as may be available from a plasma containing $CF_4$, $C_2F_6$, $CHF_3$, $CH_2F_2$, $SF_6$, $CH_3F$, and $NF_3$, and the fluorine is preferably 2-6% of the mixture. With respect to the hydrogen, however, it is also a preferred part of the overall combination in that a failure to use hydrogen has been found to fail at adequately removing residue without adversely affecting oxygen-sensitive materials such as OSG dielectric and, indeed, preferably the hydrogen is at least 50% of the mixture, although a lesser amount may be used. Further, various forms of hydrogen may be used in the overall combination, with one preferred source being NH since it is considered less hazardous in combination with oxygen, while another preferred source is $H_2$; however, other usable sources of hydrogen include $N_2H_2$, $H_2S$, and $CH_4$. Given the preceding variations of sources of the elements, one preferred combination is on the order of 80% $NH_3$, 10-15% $N_2$, 2-7% $O_2$, and 2-6% $CF_4$. Lastly with respect to step 302, it is preferably performed in the same plasma tool as used for the preceding step 106, albeit using a different chamber of that tool in the preferred embodiment. The processing conditions are preferably around: 0.5 to 6 Torr (preferably around 0.5 to 2 Torr) ambient pressure; flow rates of 2000-5000 cm$^3$/min; and an ambient temperature from room temperature to 300° C. After step 302, method 300 continues in the same manner as described earlier with respect to method 100.

From the preceding, note that method 300 may in some instances provide benefits over method 100. For example, typically wet chemistry processing is inherently more expensive than dry chemistry processing. Thus, the wet chemistry of step 108 of method 100 may cause the method to be more expensive than the dry chemistry of step 302 of method 300. As another example, since method 300 uses only dry chemistry for both steps 106 and 302, it lends itself to using a single tool rather than multiple tools as required by method 100; the need for only a single tool reduces manufacturing costs, and it also reduces the overall processing time which further reduces manufacturing costs. As another example, the use of only dry chemistry for both steps 106 and 302 by method 300 should cause a lesser amount of environmental concerns (e.g., waste disposal of used wet chemicals) as compared to the combined dry and wet chemistry of method 100. As still another example, because a wet chemistry step is not used, then the optional annealing step 110 of method 100 is not needed for drying in method 300, although it still may be beneficial in reducing $CuO_x$ to Cu if present. As a final example, it is not clear but is possible that the wet chemistry of method 100 may have an undesirable effect on a carbon-containing oxide layer while the all dry chemistry approach of method 300 is predicted not to have such an effect.

Having described various alternatives for the preferred embodiment, it is noted that the present inventive scope also may include still another alternative material for dielectric layer 226, namely, fluorinated silicon glass ("FSG"). Specifically, FSG also may be considered a low k dielectric relative to silicon dioxide in that the k value for FSG is on the order of 3.6 or less. Further, the present inventors have observed that the preceding method steps also may be applied to the formation of semiconductor devices using FSG dielectric layers with favorable yields, although using OSG may still be preferred in various applications because its value of k is considerably less than that of FSG. Moreover, the application of the present inventive teachings to OSG may be more favorable in that the prior art includes various dry alternatives for cleaning FSG, but these prior art alternatives are generally incompatible with OSG.

From the above, it may be appreciated that the above embodiments provide various approaches to a clean-up process and photoresist removal following an etch of a dielectric material. These approaches have been found to provide various benefits. For example, one benefit is that dielectric materials having dielectric constants on the order of 3.6 or less may be used in semiconductor devices, while the photoresist used to protect dielectric materials during the etch through such materials may be effectively removed along with any related polymeric residue. As another example, semiconductor circuits may be constructed efficiently using thinner films of low dielectric constant carbon-containing oxides, thereby decreasing device size and cost while increasing device performance. As still another example, the preferred embodiments contemplate various alternatives, including one photoresist strip/residue removal method that includes both wet and dry chemistries and another photoresist strip/residue removal method that includes only dry chemistry. As yet another example, the inventive scope has been shown to include various sources of different elements (e.g., hydrogen, nitrogen, fluorine), thereby giving rise to numerous alternative implementations of the present inventive teachings. As a final example, while the preferred embodiment has been demonstrated in one interconnect layer and in connection with the formation of a via in a trench to form an interconnect, it may be used with other layers as well as with other types of interconnects. As an example relating to interconnects, while FIGS. 2e and 2f illustrate a single interconnect with a via formed within a trench as with one possible dual damascene process, the reverse order may also be used (via formation prior to trench formation). Both vias and trenches are filled with a conductor. Numerous other examples are ascertainable by one skilled in the art. Consequently, while the present embodiments have been described in detail, various additional substitutions, modifications or alterations could be made to the descriptions set forth above without departing from the inventive scope which is defined by the following claims.

The invention claimed is:

1. A method of fabricating an electronic device formed on a semiconductor wafer, comprising the steps of:
    forming a layer of a first material in a fixed position relative to the wafer, wherein the first material is reactive with oxygen plasma;
    forming a photoreist layer in a fixed position relative to the layer of the first material;
    forming at least one void through the layer of the first material in response to the photoresist layer, wherein the step of forming at least one void further forms a polymeric residue in response to the photoresist layer;
    subjecting the semiconductor wafer to a plasma which incorporates a gas which includes hydrogen so as to remove the photoresist layer; and
    removing the polymeric residue by subjecting the semiconductor wafer to a dry plasma having a mixture of at approximately 80% $NH_3$, approximately 2-7% $O_2$, approximately 10-15% $N_2$, and approximately 2-6% $CF_4$.

* * * * *